US007489181B2

(12) United States Patent
Pastorina et al.

(10) Patent No.: US 7,489,181 B2
(45) Date of Patent: Feb. 10, 2009

(54) CIRCUIT WHICH CAN BE PROGRAMMED USING A RESISTOR AND WHICH HAS A REFERENCE CURRENT SOURCE

(75) Inventors: Salvatore Pastorina, Catania (IT); Wolfgang Horchler, Rosenheim (DE)

(73) Assignee: Infineon Technologies AG, Munich (DE)

( * ) Notice: Subject to any disclaimer, the term of this patent is extended or adjusted under 35 U.S.C. 154(b) by 20 days.

(21) Appl. No.: 11/507,385

(22) Filed: Aug. 18, 2006

(65) Prior Publication Data

US 2007/0052480 A1 Mar. 8, 2007

(30) Foreign Application Priority Data

Aug. 18, 2005 (DE) ...................... 10 2005 039 138

(51) Int. Cl.
*G11C 5/14* (2006.01)

(52) U.S. Cl. ........................................ 327/530; 326/37

(58) Field of Classification Search ................ 327/530; 326/37

See application file for complete search history.

(56) References Cited

U.S. PATENT DOCUMENTS

| | | | | | |
|---|---|---|---|---|---|
| 5,235,222 | A | * | 8/1993 | Kondoh et al. | 326/83 |
| 5,510,729 | A | * | 4/1996 | Reymond | 326/33 |
| 5,581,197 | A | * | 12/1996 | Motley et al. | 326/30 |
| 5,585,741 | A | * | 12/1996 | Jordan | 326/30 |
| 5,712,557 | A | * | 1/1998 | Gehrt et al. | 323/316 |
| 5,977,817 | A | | 11/1999 | de la Soujeole | 327/538 |
| 6,064,224 | A | * | 5/2000 | Esch et al. | 326/30 |
| 6,157,206 | A | * | 12/2000 | Taylor et al. | 326/30 |
| 6,307,791 | B1 | * | 10/2001 | Otsuka et al. | 365/189.05 |
| 6,414,512 | B1 | * | 7/2002 | Moyer | 326/30 |
| 6,504,397 | B1 | * | 1/2003 | Hart et al. | 326/30 |
| 6,556,039 | B2 | * | 4/2003 | Nagano et al. | 326/30 |
| 6,573,746 | B2 | * | 6/2003 | Kim et al. | 326/30 |
| 6,924,660 | B2 | * | 8/2005 | Nguyen et al. | 326/30 |
| 7,157,895 | B2 | * | 1/2007 | Naffziger et al. | 323/315 |
| 7,221,193 | B1 | * | 5/2007 | Wang et al. | 327/108 |

FOREIGN PATENT DOCUMENTS

| | | | |
|---|---|---|---|
| DE | 100 33540 | C2 | 5/2002 |
| EP | 0 899 645 | A2 | 3/1999 |
| GB | 2 407 881 | A | 5/2005 |

* cited by examiner

*Primary Examiner*—Kenneth B. Wells
(74) *Attorney, Agent, or Firm*—Maginot Moore & Beck

(57) ABSTRACT

A circuit configured to be programmed using a resistor includes an output terminal, a reference voltage source, a first circuit, and a current mirror arrangement. The output terminal is configured to be connected to a programming resistor. The reference voltage source is configured to generate a reference voltage on the output terminal. The measurement and evaluation circuit is configured to detect an output current on the output terminal, and to generate a control signal which is dependent on the output current. The current mirror arrangement is coupled to an output current path containing the output terminal and provides a reference current which is dependent on the output current and the control signal.

17 Claims, 5 Drawing Sheets

| S30_1 | S30_2 | S433 | S435 | S437 |
|---|---|---|---|---|
| 0 | 0 | 1 | 0 | 0 |
| 0 | 1 | 0 | 1 | 0 |
| 1 | 1 | 0 | 0 | 1 |

CIRCUIT WHICH CAN BE PROGRAMMED USING A RESISTOR AND WHICH HAS A REFERENCE CURRENT SOURCE

FIELD OF THE INVENTION

The present invention relates to a circuit which can be programmed using a resistor and which has a reference current source.

BACKGROUND OF THE INVENTION

In circuits that can be programmed using a resistor, various operating states or various operating parameters can be set by a user using an external resistor. In this context, the operating states or operating parameters are set using an external resistor which the user can connect to an output terminal of the circuit. For each of the different operating states or operating parameters, one or more resistors with a prescribed resistance value needs to be connected.

The circuit ascertains the resistance value of the connected resistor and, on the basis of the ascertained resistance value, generates a control signal which sets the operating state or operating parameter. To ascertain the resistance value, a reference voltage is applied across the external resistor, and the output current flowing through the external resistor via the output terminal is ascertained. In this case, the number of different values which this output current can assume corresponds to the number of different operating states or operating parameters which can be set using the external resistor.

Besides a reference voltage source generating the reference voltage applied across the external resistor, such circuits usually also require exact reference currents. A reference current of this kind can be generated, in principle, by applying an exact reference voltage to a nonreactive resistor. In this connection, a prerequisite for exact generation of a reference current is that a reference voltage is generated which is subject only to small fluctuations, and that the resistor has exactly the resistance value which is required in order to generate the desired reference current taking into account the reference voltage. An exact reference voltage can be generated in integrated circuits using a bandgap circuit, for example. However, producing a nonreactive resistor whose resistance value can be set exactly and is subject only to small production-related fluctuations is barely possible in integrated circuits, or is possibly only with a very high level of complexity.

A reference current for integrated circuits is therefore usually generated using external resistors which can be produced with comparatively small production-related fluctuations, usually less than 1%. However, connecting an external resistor of this kind in order to generate an internal reference current requires an additional connection terminal, whose implementation is associated with additional space requirement and with additional costs.

SUMMARY

It is an aim of at least some embodiments of the present invention to provide a circuit which can be programmed using a resistor and which has a reference current source, wherein generating the reference current does not require an additional connection terminal for connecting an external resistor.

This aim is achieved by a circuit which can be programmed using a resistor in accordance with embodiments of the invention.

A first embodiment is a circuit, configured to be programmed using a resistor, that includes an output terminal, a reference voltage source, a first circuit, and a current mirror arrangement. The output terminal is configured to be connected to a programming resistor. The reference voltage source is configured to generate a reference voltage on the output terminal. The measurement and evaluation circuit is configured to detect an output current on the output terminal, and to generate a control signal which is dependent on the output current. The current mirror arrangement is coupled to an output current path containing the output terminal and provides a reference current which is dependent on the output current and the control signal.

The present invention is explained in more detail below with reference to figures.

DETAILED DESCRIPTION

In the figures, unless otherwise stated, identical reference symbols denote identical circuit components and signals with the same meaning.

In general, at least some embodiments of the inventive circuit which can be programmed using a resistor have an output terminal for connecting a programming resistor, a reference voltage source, a measurement and evaluation circuit and also a reference current source. The reference voltage source is designed to generate a reference voltage on the output terminal, and the measurement and evaluation circuit is designed to detect an output current flowing on the output terminal and to generate a control signal which is dependent on the output current. The circuit's reference current source has a current mirror arrangement which is actuated by the control signal and which is coupled to an output current path containing the output terminal and which provides a reference current which is dependent on the output current and the control signal.

During operation of this circuit, a programming resistor is connected to the output terminal. The control signal which is dependent on a current flowing to the output terminal and which, for a firmly prescribed reference voltage, is dependent on the resistance value of the connected programming resistor is used in the circuit to set an operating state or one or more operating parameters for the circuit, for example. The circuit is thus "programmable" using this programming resistor.

In addition, the programming resistor in the circuit is also used to generate the reference current. In this context, use is made of the fact that during correct operation of this circuit only resistors whose resistance values have been specified for the circuit and whose resistance values are subject only to small production-related fluctuations are connected to the circuit. The programming resistor used is preferably a discrete resistor element which is connected to the circuit externally. Production-related fluctuations in such discrete resistor elements are in the range of just 1% or below.

The control signal generated by the measurement and evaluation circuit contains information about the programming resistor connected to the output terminal and therefore contains information about the current flowing to the output terminal. This information which the control signal contains is used in the reference current source to map the current flowing to the output terminal onto a reference current, using a current mirror arrangement, in such a way that this reference current assumes a prescribed reference current value.

Figure 1:
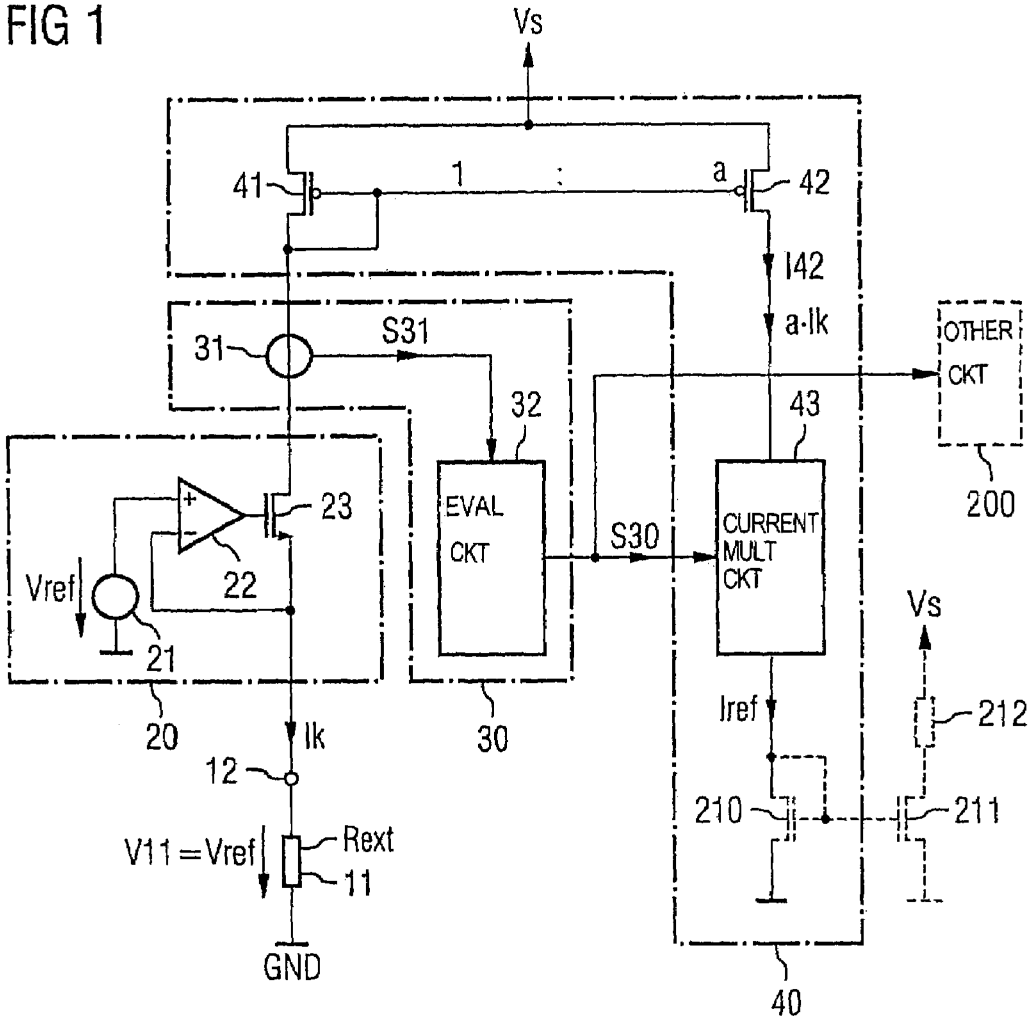
FIG. 1 shows a first exemplary embodiment of an inventive circuit having an output terminal and a measurement and evaluation circuit which evaluates a current to the output terminal and which provides a control signal which actuates a reference current source.

FIG. 1 shows a first exemplary embodiment of an inventive circuit which can be programmed using a programming resistor 11.

The circuit arrangement has an output terminal 12 for connecting the programming resistor 11. In the example, this programming resistor 11 is connected between the output terminal 12 and a reference ground potential GND, which also forms the reference ground potential for the other circuit components of the inventive circuit, which will be explained below. In this case, the programming resistor can be connected to the reference ground potential GND externally, i.e., outside of the circuit.

If the reference ground potential of the circuit components in the circuit does not match an external reference ground potential, the programming resistor can be connected to the reference ground potential of the circuit via a further connection terminal in a manner which is not shown in more detail.

The circuit arrangement has a reference voltage source 20 which is designed to generate on the output terminal 12 a reference voltage Vref for the reference ground potential GND to which the programming resistor 11 is connected. In the example, this reference voltage source 20 has a current regulator with an operational amplifier 22 and a transistor 23 acting as a regulating element, the regulating transistor 23 being connected in series with the programming resistor 11. The operational amplifier 22 compares a voltage V11 applied across the programming resistor 11 with a reference voltage Vref generated by an internal voltage source 21 and adjusts an output current Ik flowing to the output terminal such that the voltage drop V11 across the programming resistor 11 corresponds to the value of the reference voltage Vref.

In this embodiment, the voltage source 21 is in the form of a bandgap reference, for example, the details of which would be known to those of ordinary skill in the art. A bandgap reference of this kind is able to generate the reference voltage Vref precisely with just minor temperature-related fluctuations.

In the example, the regulating transistor 23 and the programming resistor 11 are part of an output current path which is connected between a terminal for a supply potential Vs and the reference ground potential GND. In this arrangement, the load path of the regulating transistor 23 is in series with the programming resistor 11 between the terminal for supply potential Vs and reference ground potential GND.

In addition, the circuit has a measurement and evaluation circuit 30 which is designed to detect the output current Ik flowing to the output terminal 12 and to generate a control signal S30 which is dependent on this output current Ik. In the circuit shown in FIG. 1, this measurement and evaluation circuit 30 has, to this end, a current measuring arrangement 31 which is connected in the output current path or which is coupled to the output current path and which generates a current measuring signal S31 which is dependent on the output current Ik. In this case, the current measuring arrangement is preferably designed such that the current measuring signal S31 is proportional to the output current Ik.

The current measuring signal S31 is supplied to an evaluation circuit 32 which generates a control signal S30 which is dependent on the current measuring signal S31 and which, as is sufficiently well known, can be used to set an operating state or to set one or more operating parameters in another part of the circuit. The other part of the circuit may simply be referred to as another circuit. The other circuit in which this control signal S30 is used to set the operating state or to set the operating parameter(s) is shown schematically in FIG. 1 as a circuit block and is denoted by the reference symbol 200. The circuit portion 200 is, in essence, another circuit having an operating parameter that is set in accordance with the control signal S30. Such other circuits are well known to those of ordinary skill in the art and may take many forms.

In addition, the control signal S30 generated by the measurement and evaluation circuit 30 is supplied to a reference current source 40. This reference current source 40 is designed to generate a reference current Iref on the basis of this control signal S30, and to this end has a current mirror arrangement which maps the current flowing to the output terminal Ik onto the reference current Iref as stipulated by the control signal S30. In this arrangement, the control signal S30 is used to set the current mirror factor, that is to say to set the factor which determines the ratio between the output current Ik flowing to the output terminal 12 and the reference current Iref. This current mirror factor is set using the control signal S30 with the aim of keeping the reference current Iref constant.

For the output current Ik, the following is true:

$$Ik=Vref/Rext \tag{1}$$

Here, Rext denotes the resistance value of the programming resistor 11. The reference current Iref is proportional to the output current Ik and also is constant, that is to say the following is true:

$$Iref=b\cdot Ik=\text{const.} \tag{2}$$

Taking into account the fact that the output current Ik is inversely proportional to the resistance value Rext of the programming resistor 11, the current mirror factor b is set using the control signal S30 such that the current mirror factor b is proportional to the resistance value Rext of the external programming resistor 11. The following is thus true:

$$b \sim Rext \tag{3}$$

With a current mirror factor chosen in this manner, the reference current Iref is proportional to the reference voltage Vref.

The reference current source 40 shown in FIG. 1 has a first current mirror with current mirror transistors 41, 42. An input transistor 41 in this current mirror is connected up as a diode and is connected in the output current path. An output transistor 42 coupled to the input transistor 41 provides an output current I42 which is proportional to the output current Ik through the current mirror ratio of these two transistors. With a current mirror ratio between the input transistor 41 and the output transistor 42 of 1:a, where a=1 may be the case, the following is true for this current I42:

$$I42=a\cdot Ik \tag{4}$$

This current I42 which is proportional to the output current Ik is supplied to a current multiplication circuit 43. The current multiplication circuit 43 takes this current I42 and generates the reference current Iref as stipulated by the control signal S30. In the example, this reference current Iref takes reference ground potential GND as a reference and can be tapped off using conventional current mirror circuits in order to generate reference currents which are proportional to this reference current Iref using any loads which occur in the circuit. The reference symbols 210, 211 in FIG. 1 denote the transistors in a current mirror which maps the reference current Iref onto a load 212 which is connected in series with the output transistor 211 in this current mirror.

The control signal S30 is used to set the multiplication factor for the current multiplication circuit 43 such that the reference current Iref is constant. This is achieved by virtue of the multiplication factor being proportional to the resistance value Rext of the programming resistor 11, taking into account the multiplication factor a of the current mirror 41, 42. The information about the resistance value Rext of the connected programming resistor 11 is obtained by the evaluation circuit 32, which generates the control signal S30, from the current measuring signal S31 which is proportional to the output current.

Figure 2:
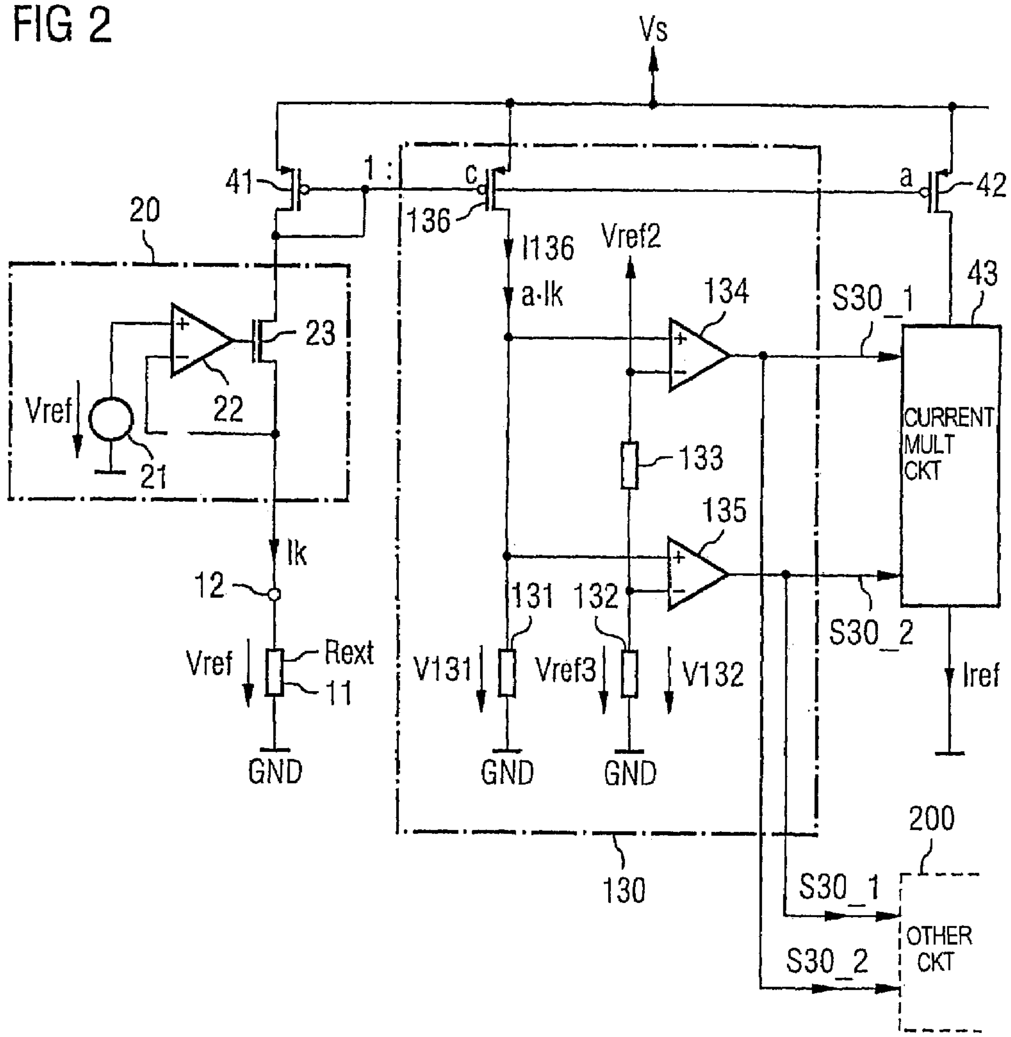
FIG. 2 shows a second exemplary embodiment of an inventive circuit.

FIG. 2 shows an inventive circuit having a measurement and evaluation circuit 130 which generates two control signals S30_1, S30_2 which are supplied to the control circuit 43 in the reference current source 40. In the example, these two control signals S30_1 and S30_2 are output signals from comparators 134, 135 and can respectively assume two signal states, a High level and a Low level. These two control signals S30_1, S30_2 form a digital control signal with a length of 2 bits, that is to say that the following is true:

$$S30=[S30\_1, S30\_2] \quad (5).$$

For the subsequent explanation, it is assumed that a High level of the respective control signal represents a logic one and a Low level of the respective control signal represents a logic zero.

The measurement and evaluation circuit 130 is designed to generate the control signals S30_1, S30_2 on the basis of the output current Ik. In this regard, the measurement and evaluation circuit 130 comprises a current mirror transistor 136 which is coupled to the current mirror transistor 41, which is connected up as a diode in the output current path. A current I136 flowing through this current mirror transistor 136 in the measurement and evaluation circuit 130 is related to the output current Ik by means of the current mirror ratio for the two current mirror transistors 41, 136. For a current mirror ratio of 1:c, the following is true for this current I136:

$$I136=c\cdot Ik \quad (6).$$

This current I136 brings about a voltage drop V131 across a measurement resistor 131 connected in series with the current mirror transistor 136, and said voltage drop is compared with two reference voltages by means of the comparators 134, 135. The first comparator 134 compares this voltage drop V131 with a first reference voltage Vref2 which is generated by a reference voltage source (not shown in more detail). The reference voltage value Vref3 with which the voltage drop V131 is compared by the second comparator 135 is generated by means of a voltage divider 132, 133 from the first reference voltage Vref2. For this second reference voltage Vref3, the following applies in this case:

$$Vref3=Vref2\cdot R132/(R132+R133) \quad (7).$$

Here, R132, R133 denote the resistance values of the voltage divider resistors 132, 133.

The 2-bit control signal at the output of the measurement and evaluation circuit 130 can assume three different values. The control signal assumes a first value S30=[0, 0] when the voltage drop V131 is smaller than the second reference value Vref3. The control signal assumes a second value S30=[0, 1] when the voltage drop V131 is larger than the second reference value Vref3 but smaller than the first reference value Vref2, and the control signal assumes a third value S30=[1, 1] when the voltage drop V131 is larger than the first reference value Vref2.

The measurement and evaluation circuit 130 shown is suitable for circuits in which the external resistor 11 can be used to program three different operating states or parameters. To program these three operating states or parameters, different external resistors 11, but which have firmly prescribed resistance values, whose resistance values differ from one another but are firmly prescribed are connected to the output terminal 12. The individual resistance values of this external resistor Rext which are used to set the individual operating states or operating parameters are denoted by R1, R2, R3 below, where R1>R2>R3.

With a prescribed reference voltage Vref, the output current Ik assumes three different values for which the following is true:

$$Ik\_i=Vref/Ri \text{ where } i=1, 2, 3 \quad (8).$$

The current mirror ratio of the two transistors 41, 136, the resistance value of the measurement resistor 131 and also the two reference voltages Vref2, Vref3 need to be in tune with these three possible output currents Ik_i so that these three different output currents are mapped onto different control signals.

Figure 3:
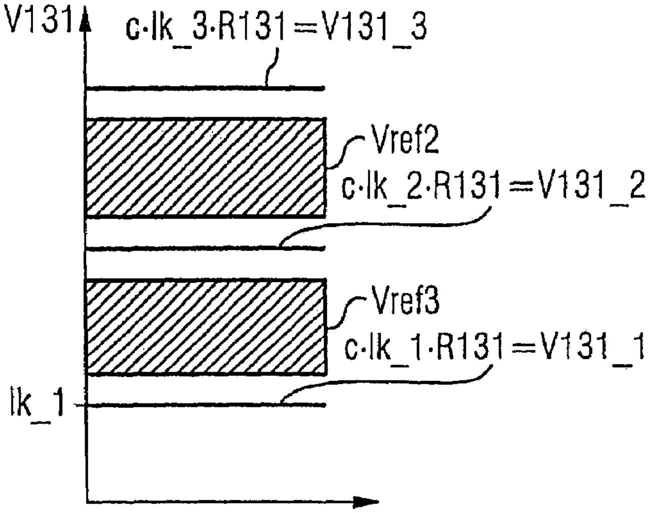
FIG. 3 illustrates signal levels for selected voltages in the circuit shown in FIG. 2 for different programming resistors.

FIG. 3 graphically illustrates the ratio of the three possible voltage drops $$V131\_i=c\cdot Ik\_i\cdot R131 \text{ where } i=1, 2, 3 \quad (9)$$

across the measurement resistor 131 relative to the reference voltages. The second reference voltage Vref3 must be larger than the voltage drop caused by the measurement current I136=c·Ik_1 on the measurement resistor 131, but this second reference value Vref3 must be smaller than a voltage drop caused by the second output current Ik_2 on the measurement resistor 131. And the first reference value Vref2 must be smaller than a voltage drop across the measurement resistor 131 caused by the third output current Ik_3.

Figure 4:
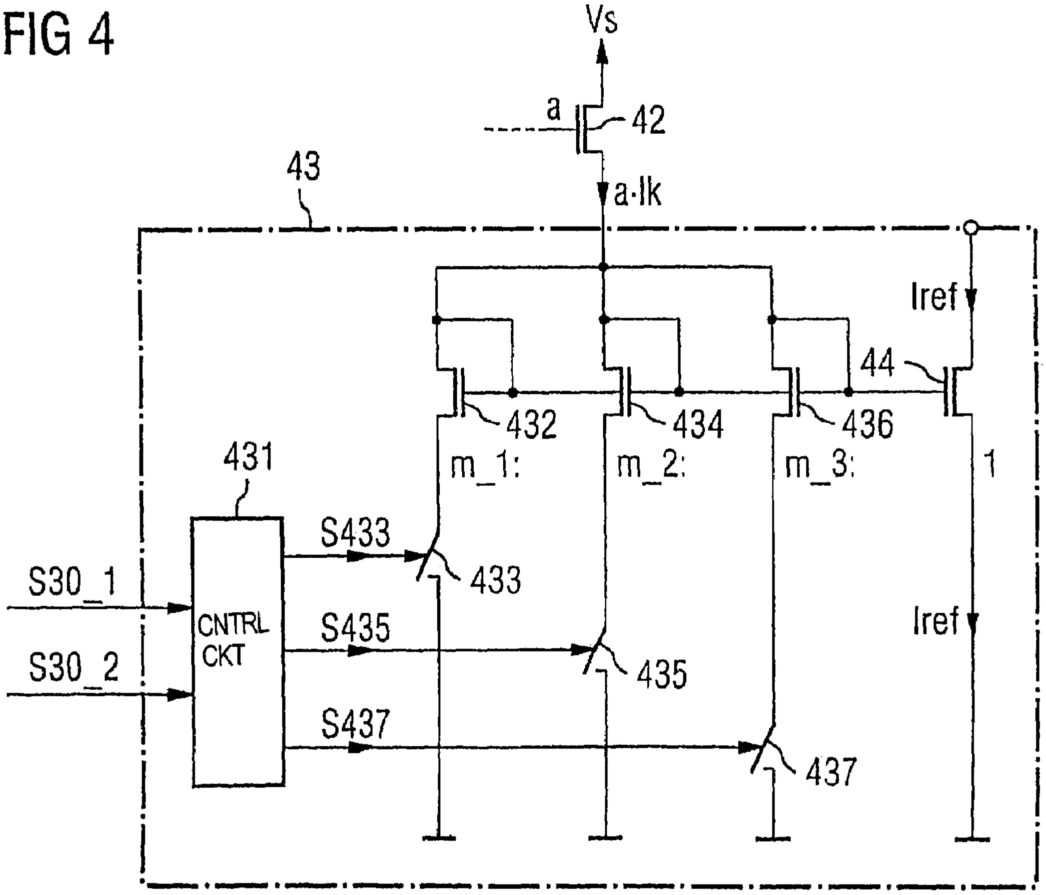
FIG. 4 shows a circuit implementation example for a current mirror arrangement which can be actuated by a control signal.

FIG. 4 shows a circuit implementation example for a current multiplier circuit 43 which generates the reference current Iref on the basis of the output current Ik and the control signal S30. This multiplier circuit is supplied with the current a·Ik which is proportional to the output current Ik. The multiplier circuit 43 has a current mirror with an input stage and an output stage. The input stage has three input transistors 432, 434, 436 which, in the example, are respectively implemented as n-channel MOS transistors connected up as diodes. These input transistors 432, 434, 436 are respectively coupled to an output transistor 44, which is likewise in the form of an n-channel MOS transistor. This output transistor 44 has the reference current Iref flowing through it during operation.

The input transistors 432, 434, 436 can be activated and deactivated on the basis of the control signal S30. To this end, controllable switches 433, 435, 437 which, on the basis of their switching state, allow a flow of current through the respective input transistor 432, 434, 436 or turn off the respective input transistor are respectively connected in series with the individual input transistors. These switches 433, 435, 437, which are actuated via a control circuit 431 on the basis of the control signal S30, can be used to set the current mirror ratio for the current mirror and hence the multiplication factor by which the input current a·Ik is multiplied in order to generate the reference current. The current mirror ratio is given by the transistor area of the activated input transistors 432, 434, 436 relative to the transistor area of the output transistor 44.

To be able to set the reference current Iref for the three different output currents Ik to a respective constant value, three different current mirror ratios can be set, which are subsequently denoted by m_i:1 where i=1, 2, 3. For the reference current Iref, the following is true:

$$Iref=1/m\_i\cdot a\cdot Ik\_i \quad (10).$$

The value 1/m_i is subsequently called the current mirror factor, which determines the mapping of the input current a·Ik onto the reference current Iref. To generate a constant output current Iref for different input resistors (11 in FIG. 2), different current mirror factors can be set which are respectively proportional to the different input resistors. The individual current mirror factors are in the same ratio with one another as the external resistors, that is to say the following is true:

$$R1:R2:R3=m\_1^{-1}:m\_2^{-1}:m\_3{-1} \quad (11).$$

With the largest external resistor R1, the smallest output current Ik_1 flows, and the current mirror factor m_$\mathbf{1}^{-1}$ therefore needs to be at its largest in order to generate the reference current Iref, whereas for the smallest output resistor R3 and the therefore largest output current Ik_3 the current mirror factor m_$\mathbf{3}^{-1}$ needs to be at its smallest.

The different current mirror factors can be generated in the multiplier circuit 43 by virtue of three different input transistors 432, 434, 436 being provided whose areas are in different ratios with the output transistor 44 and of which only one is ever activated by means of the control signals S433, S435, S437. For the area ratio between the first input transistor 432 and the output transistor, m_1:1 is true, m_2:1 is true for the ratio between the second transistor 434 and the output transistor 44, and m_3:1 is true for the ratio between the third transistor 436 and the output transistor 44. The transistor area of the first transistor 432 is therefore smaller than the transistor areas of the two other transistors 434, 436.

The control circuit 431 is a logic circuit which maps the 2-bit control signal S30 onto the switch control signals S433, S435, S437. The mapping function used by this logic circuit to map the control signal will become clear from the table in FIG. 5.

With a control signal S30=[0, 0] which is present when the external resistor has the largest value, the switch 433 is on in order to set the largest of the three possible current mirror factors m_$\mathbf{1}^{-1}$. Accordingly, when a control signal S30=[1, 1] which is achieved when the smallest of the three possible input resistors is connected, the third switch 437 is on in order to set the smallest of the three possible current mirror factors.

It goes without saying that it is also possible to set the different current mirror factors by activating a plurality of the input transistors. In this context it should be noted that the total area of the activated input transistors must be in the desired ratio with the area of the output transistor in order to set the current mirror factor which is required to achieve a constant output current Iref.

The previously explained current multiplication circuit 43 shown in FIG. 4 can easily be expanded by adding further input transistors to the current mirror arrangement in order to be able to set more than three different multiplication factors. Accordingly, the evaluation circuit 130 shown in FIG. 2 can easily be expanded by adding further comparators and by expanding the voltage divider in order to be able to distinguish more than three different measurement voltages V131 which are proportional to the output current Ik and to generate a control signal with more than 2 bits.

Figure 6:
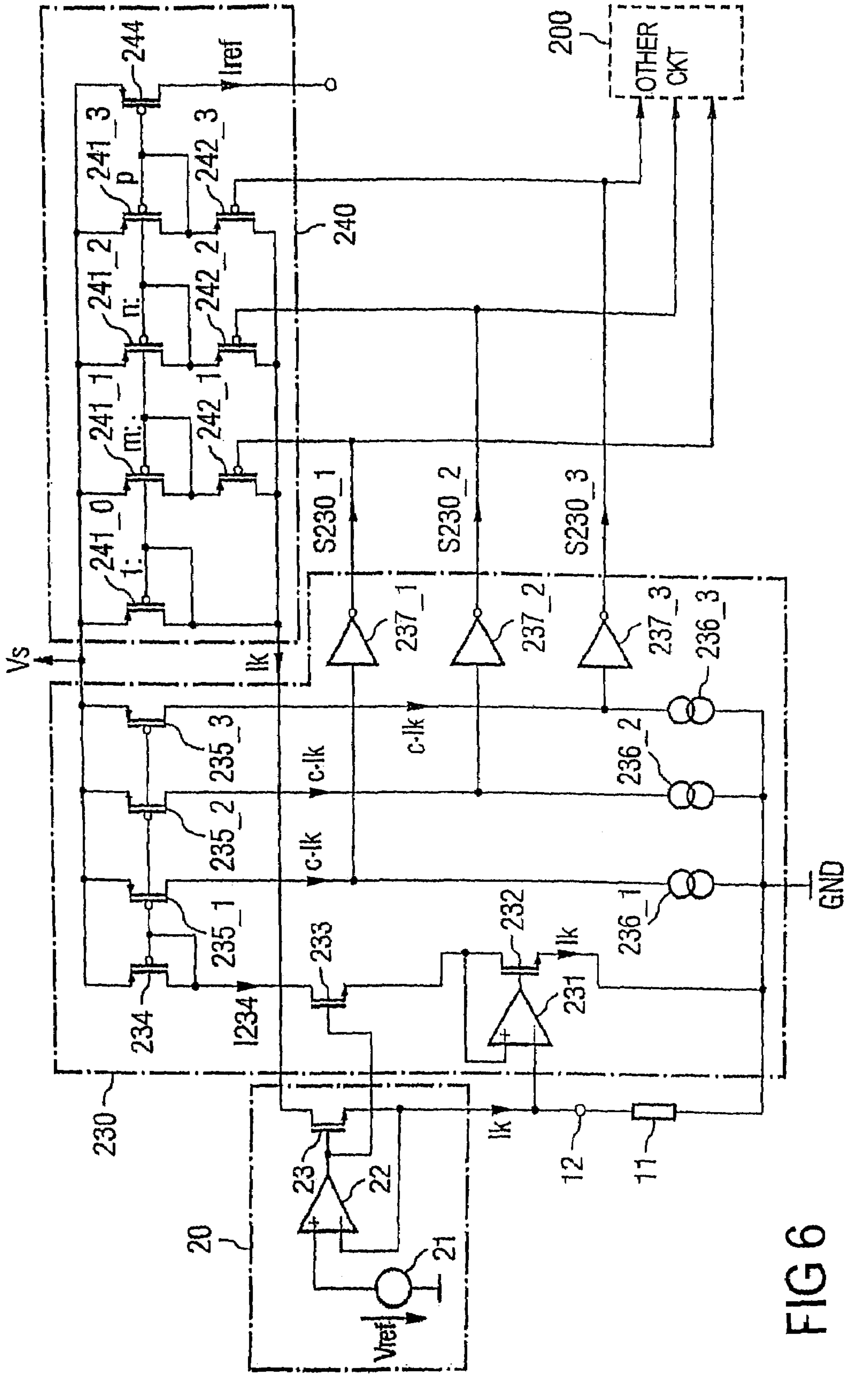
FIG. 6 shows another exemplary embodiment of an inventive circuit.

Another exemplary embodiment of the inventive circuit is shown in FIG. 6. This circuit has a current mirror 240 with a current mirror factor which can be set as stipulated by a digital control signal S230. An output of this current mirror 240 provides the reference current Iref. In the example, the control signal S230 is a 3-bit control signal, for which the following is true:

$$S230=[S230\_1, S230\_2, S230\_3] \quad (12).$$

In the example, this current mirror 240 has four input transistors S241_0, S241_1, S241_2, S241_3 which are connected directly in the output current path, one of the input transistors 241_0 being permanently connected in the output current path while the other input transistors 241_1, 241_2, 241_3 are connected into the output current path as stipulated by the control signal S230, in order thereby to set the current mirror ratio or the current mirror factor.

The control signal S230 is generated by a measurement and evaluation circuit 230 which has a further current mirror and three comparators. This current mirror has an input transistor 234 and three output transistors 235_1, 235_2, 235_3. The input transistor 234 has a current I234 flowing through it which, in the example, corresponds to the output current Ik but which must be merely proportional to the output current Ik. The input current path of this current mirror has a second regulating transistor 233 which is actuated by means of the operational amplifier 22 in the reference current source in line with the first regulating transistor 23. Connected in series with this second regulating transistor 233 is a further regulating transistor 232 which is actuated by means of a further operational amplifier 231 such that a voltage between the node which is common to the second regulating transistor 233 and to the further regulating transistor 232 and the output terminal 12 is equal to zero. In this case, the output current Ik is equal to the current I234 in the input current path of the current mirror.

This current Ik flowing in the input current path of the current mirror arrangement 230 is mapped onto equal output currents c·Ik by means of the output transistors 235_1, 235_2, 235_3. The output transistors 235_1, 235_2, 235_3 are respectively connected in series with current sources 236_1, 236_2, 236_3, with an output transistor and a current source connected in series therewith respectively forming a comparator. The outputs of these comparators are respectively formed by the node which is common to the output transistor 235_1, 235_2, 235_3 and the current source 236_1, 236_2, 236_3. The potential on this output node is respectively supplied to an inverting buffer 237_1, 237_2, 237_3 whose output has the individual components S230_1, . . . , S230_3 of the control signal S230 applied to it.

The respective control signal S230_i assumes a High level when the current c·Ik derived from the output current Ik is larger than the current delivered by the current source 236_1, . . . , 236_3 of the respective comparator. These currents delivered by the current sources are respectively in tune with the possible output currents Ik such that it is possible to distinguish between four different external resistors 11 and four different output currents Ik_i, where i=1, 2, 3, 4. The control signal S230 assumes a first value [0, 0, 0] when the output current Ik assumes its smallest current value at the largest resistance value of the external resistor. This smallest current value is smaller than the currents delivered by the current sources 236_1, . . . , 236_3. The control signal S230 assumes a second value S230=[1, 0, 0] when the mapped current c·Ik is larger than the current delivered by the first current source 236_1 but smaller than the currents from the second and third current sources 236_2, 236_3. A third control signal value S230=[1, 1, 0] is present when the mapped current c·Ik is larger than the current delivered by the second current source 236_2 but smaller than the current delivered by the third current source 236_3. And a third control signal value S230=[1, 1, 1] is assumed when the mapped current c·Ik is larger than the current delivered by the third current source 236_3.

In the example shown, the input transistors 241_1, 241_2, 241_3 are activated as the output current Ik becomes larger and hence the programming resistance becomes smaller. For the largest of the four permissible resistance values, only the first input transistor 241_0 is activated, whereas all four input transistors 241_0, . . . , 241_3 are activated for the smallest possible resistance value.

In this context, the area ratios of these input transistors are in tune with one another such that a respective constant reference current Iref is obtained for four different output currents Ik. By way of example, it will be assumed that the following is true for the resistance values R1, R2, R3, R4 of the external resistor 11:

$$R1=2^1\cdot R2=2^2\cdot R3=2^3\cdot R4 \quad (13),$$

that is to say that the individual resistors respectively differ from one another through integer powers of 2 and that for each of the resistance values the next largest resistance value respectively differs by the factor 2.

In this case, the desired current mirror factors can be generated through successive connection of the input transistors 241_1, 241_2, 241_3 when the following is true for the area ratios of these transistors:

$$1:m:n:p=1:1:2:4 \quad (14).$$

In the circuit shown in FIG. 6, the input transistors 241_1, . . . , 241_3 are connected in series with activation transistors 242_1, . . . , 242_3 which are respectively actuated by the control signals S230_1, S230_3.

Figures 5, 7:
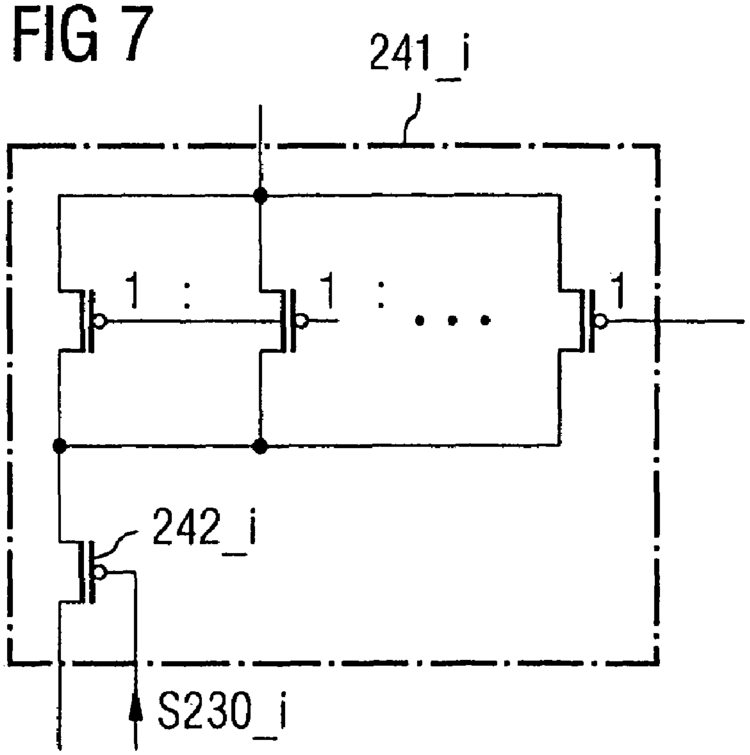
FIG. 5 illustrates logic levels for selected signals in the circuit shown in FIG. 4 for different "programming resistors".
FIG. 7 shows a circuit implementation example for a detail of the circuit shown in FIG. 6.

With reference to FIG. 7, the various transistor areas of the input transistors can be implemented in a manner which is known sufficiently well by connecting a plurality of transistors with the same respective transistor area in parallel.

In the case of the circuit shown in FIG. 6 the input transistors are connected directly in the output current path, which means that the sum of the currents through the respective input transistors activated as stipulated by the control signal S30 corresponds to the output current. It goes without saying that it is also possible to provide another arrangement, corresponding to the arrangement with the regulating transistors 232, 233 and the operational amplifier 231, which generates a map of the output current, and to connect the input transistors in series with this further arrangement.

In the description above, it has been assumed that different current mirror factors for the current mirror arrangements 40 (FIG. 1), 240 (FIG. 6) are set by varying the number of input transistors in a current mirror. It goes without saying that it is also possible to vary the current mirror factor by providing just one input transistor but a plurality of output transistors which can be activated as stipulated by the control signal. Hybrid forms can also be used which comprise a plurality of input transistors and a plurality of output transistors, respectively activated as stipulated by the control signal.

The invention claimed is:

1. A circuit configured to be programmed using a resistor, the circuit comprising:
- an output terminal configured to be connected to a programming resistor,
- a reference voltage source configured to generate a reference voltage on the output terminal;
- a measurement and evaluation circuit configured to detect an output current on the output terminal and to generate a control signal which is dependent on the output current,
- a current mirror arrangement which is coupled to an output current path containing the output terminal and which provides a reference current which is dependent on the output current and the control signal, the current mirror arrangement including a first current mirror having a current mirror ratio that is dependent on the control signal, and a second current mirror which generates a current which is proportional to the output current and which is supplied to the first current mirror as input current.

2. The circuit as claimed in claim 1, wherein the first current mirror has at least two input transistors and at least one output transistor, the input transistors being activated or deactivated on the basis of the control signal.

3. The circuit as claimed in claim 1, wherein the first current mirror has at least two output transistors and at least one input transistor, the output transistors being activated or deactivated on the basis of the control signal.

4. The circuit as claimed in claim 2, wherein the input transistors in the first current mirror are connected into the output current path.

5. The circuit as claimed in claim 1, wherein the measurement and evaluation circuit is configured to generate the control signal as a digital control signal.

6. The circuit as claimed in claim 2, in which the first current mirror contains switching elements connected in series with the at least two input transistors, the switching elements configured to be actuated according to the control signal.

7. The circuit as claimed in claim 6, wherein the first current mirror has a logic circuit configured to generate activation signals for the switching elements on the basis of the control signal.

8. The circuit as claimed in claim 1, wherein the measurement and evaluation circuit comprises:
- a current measuring arrangement configured to provide a current measuring signal representative of the output current,
- an evaluation circuit having at least one comparator operable to perform a comparison of the current measuring signal with at least one reference value, said evaluation circuit configured to generate the control signal based on the comparison.

9. The circuit as claimed in claim 1, wherein the reference voltage source includes an internal voltage source, an operational amplifier coupled to the internal voltage source, and a regulating element coupled to the operational amplifier and the output terminal.

10. The circuit as claimed in claim 9, wherein the regulating element comprises a transistor.

11. A circuit configured to be programmed using a resistor, the circuit comprising:
- an output terminal configured to be connected to a programming resistor,
- a reference voltage source configured to generate a reference voltage on the output terminal, a first circuit configured to generate a control signal corresponding to an output current on the output terminal, a current mirror arrangement which is coupled to an output current path containing the output terminal and which provides a reference current based on the output current and the control signal, the current mirror arrangement including a first current mirror having a current mirror ratio that is dependent on the control signal, and a second current mirror which generates a current which is proportional to the output current and which is supplied to the first current mirror as input current.

12. The circuit of claim 11, further comprising a terminal configured to be connected to another circuit configured to set an operating parameter thereof responsive to the control signal.

13. The circuit as claimed in claim 11 wherein the first current mirror has at least two input transistors and at least one output transistor, the input transistors being activated or deactivated on the basis of the control signal.

14. The circuit as claimed in claim 11 wherein the first current mirror has at least two output transistors and at least one input transistor, the output transistors being activated or deactivated on the basis of the control signal.

15. The circuit as claimed in claim 13, wherein the input transistors in the first current mirror are connected into the output current path.

16. The circuit as claimed in claim 11, wherein the first circuit is configured to generate the control signal as a digital control signal.

17. The circuit as claimed in claim 13, wherein the first current mirror contains switching elements connected in series with the at least two input transistors, the switching elements configured to be actuated according to the control signal.

* * * * *